(12) United States Patent
Lee et al.

(10) Patent No.: US 7,436,335 B2
(45) Date of Patent: Oct. 14, 2008

(54) DATA DRIVER AND LIQUID CRYSTAL DISPLAY HAVING THE SAME

(75) Inventors: Cheng-Hsiu Lee, Miao-Li (TW); Ti-Kai Chao, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 4 days.

(21) Appl. No.: 11/784,673

(22) Filed: Apr. 9, 2007

(65) Prior Publication Data

US 2007/0236379 A1    Oct. 11, 2007

(30) Foreign Application Priority Data

Apr. 7, 2006    (TW) .............................. 95112480 A

(51) Int. Cl.
*H03M 1/00*    (2006.01)
(52) U.S. Cl. .......................... 341/141; 341/144; 345/99
(58) Field of Classification Search ......... 341/130–170; 345/98–100
See application file for complete search history.

(56) References Cited

U.S. PATENT DOCUMENTS

| | | | | |
|---|---|---|---|---|
| 4,591,822 A * | 5/1986 | Versaw et al. | ................ | 337/380 |
| 5,182,768 A * | 1/1993 | Nakano et al. | ......... | 379/387.02 |
| 6,836,227 B2 * | 12/2004 | Asami | ......................... | 341/118 |
| 6,844,839 B2 * | 1/2005 | Lee et al. | ..................... | 341/144 |
| 6,867,719 B2 * | 3/2005 | Asami | ......................... | 341/118 |
| 7,268,764 B2 * | 9/2007 | Song et al. | ................... | 345/100 |
| 7,298,352 B2 * | 11/2007 | Kang et al. | ................... | 345/87 |
| 7,382,344 B2 * | 6/2008 | Lee et al. | ....................... | 345/99 |
| 2002/0063666 A1 | 5/2002 | Kang | | |

\* cited by examiner

*Primary Examiner*—Lam T Mai
(74) *Attorney, Agent, or Firm*—Wei Te Chung

(57) ABSTRACT

An exemplary data driver chip (23) includes a multiplexer (31); a first digital/analog (D/A) converter (32); and a second digital/analog (D/A) converter (33). The multiplexer receives a multiplex data stream and decomposes the multiplex data stream to a first signal and a second signal, and respectively sends the first and second signals to the first and the second D/A converters. The first D/A converter converts the first signal to an analog gamma voltage to the second D/A converter, and the second D/A converter converts the second signal to analog video signal according to the analog gamma voltage.

13 Claims, 3 Drawing Sheets

DATA DRIVER AND LIQUID CRYSTAL DISPLAY HAVING THE SAME

FIELD OF THE INVENTION

The present invention relates to data driving chip and liquid crystal display incorporating same.

BACKGROUND

A typical liquid crystal display (LCD) is capable of displaying a clear and sharp image through thousands or even millions of pixels that make up the complete image. The liquid crystal display has thus been applied to various electronic equipment in which messages or pictures need to be displayed, such as mobile phones and notebook computers.

As shown in FIG. 4, a typical liquid crystal panel 10 generally includes a main printed circuit board (PCB) 11, a data driver chip 13, a gate driver chip 12, a liquid crystal panel 14 and a flexible printed circuit (FPC) 15. The liquid crystal (LC) panel 14 generally has a thin film transistor (TFT) array substrate (not shown), a color filter substrate (not shown) opposite to the TFT array substrate, and a liquid crystal layer (not shown) sandwiched between the two substrates. The main PCB 11 respectively provides controlling signals to the data driver chip 13 and the gate driver chip 12 through the FPC 15. The data driver chip 13 and the gate driver chip 12 are disposed on the liquid crystal panel 14 by chip on glass (COG) technology, which are electrically connected with wires (not shown) on the liquid crystal panel 14 through the anisotropic conductive film (ACF), for transmitting image signals to the LC panel 14.

Referring to FIG. 5, a typical data driver chip 13 includes a digital/analog (D/A) converter 131. The D/A converter 131 is used to transform red (R), green (G), blue (B) (R/G/B) digital video signals to analog signals and outputs the analog signals to the liquid crystal panel 14. The D/A converter 131 has a digital input end 133, an analog input end 134 and an analog output end 135. The digital input end 133 receives the R/G/B digital video signals, the analog input end 134 receives analog gamma voltage signals, and the analog output end 135 outputs the analog signals to the liquid crystal panel 14. The analog gamma voltage signals from a gamma voltage generator (not shown) is set to have a different voltage magnitude in correspondence with a gray level value.

However, the D/A converter 131 is encapsulated in the data driver chip 13, its digital input end 133, analog input end 134 and analog output end 135 are all encapsulated in the data driver chip 13 through a plurality of pins to electrically connect with the main PCB 11 and the liquid crystal panel 14. Thus, the D/A converter 131 adds the numeral of the pins, which also need increase the wires and pins of the FPC 15. Therefore, it complicates the manufacturing processes and adds the manufacturing difficulty.

Therefore, a new data driver chip and liquid crystal display that can overcome the above-described problems are desired.

SUMMARY

In one embodiment, an exemplary data driver chip includes a multiplexer; a first digital/analog (D/A) converter; and a second digital/analog (D/A) converter. The multiplexer receives a multiplex data stream and decomposes the multiplex data stream to a first signal and a second signal, and respectively sends the first and second signals to the first and the second D/A converters. The first D/A converter converts the first signal to an analog gamma voltage to the second D/A converter, and the second D/A converter converts the second signal to analog video signal according to the analog gamma voltage.

In another embodiment, an exemplary liquid crystal display includes a liquid crystal panel; a main print circuit board (PCB); a gate driver chip electrically connecting the liquid crystal panel and the main PCB; and a data driver chip. The data driver chip includes a multiplexer; a first digital/analog (D/A) converter; and a second digital/analog (D/A) converter electrically connecting with the liquid crystal panel. The multiplexer respectively electrically connects with the main PCB, the first and the second D/A converters, and the first D/A converter electrically connects to the second D/A converter.

Other advantages and novel features of the embodiments will become more apparent from the following detailed description when taken in conjunction with the accompanying drawings; in which:

DETAILED DESCRIPTION OF PREFERRED EMBODIMENTS

Figure 1:
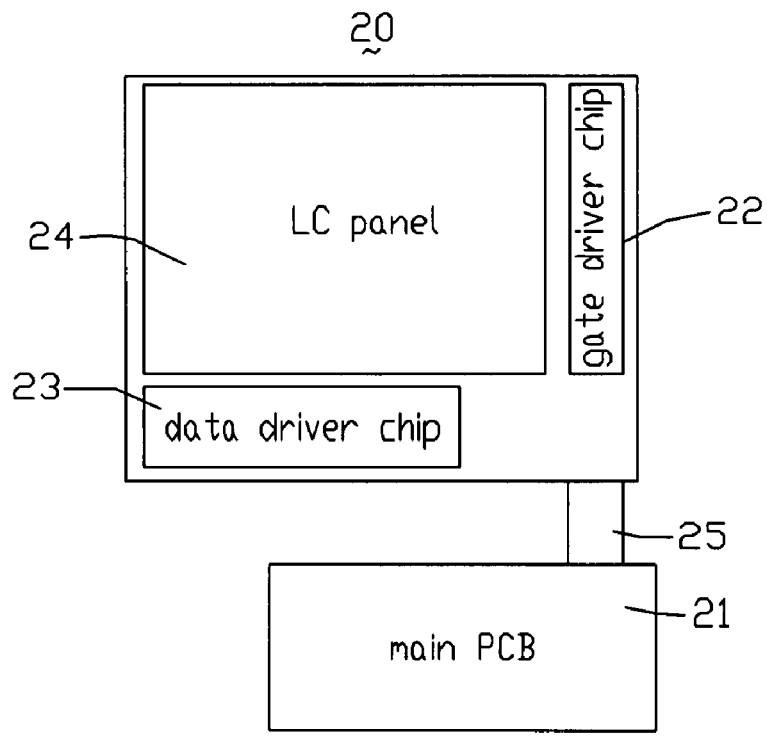
FIG. 1 is a schematic view of a liquid crystal display according to an exemplary embodiment of the present invention, which has a data driver chip.

Referring to FIG. 1, a liquid crystal display 20 according to a first preferred embodiment of the present invention is shown. The liquid crystal display 20 includes a main printed circuit board (PCB) 21, a data driver chip 23, a gate driver chip 22, a liquid crystal (LC) panel 24 and a flexible printed circuit (FPC) 25. The liquid crystal panel 24 generally has a thin film transistor (TFT) array substrate (not shown), a color filter substrate (not shown) opposite to the TFT array substrate, and a liquid crystal layer (not shown) sandwiched between the two substrates. The main PCB 21 respectively provides controlling signals to the data driver chip 23 and the gate driver chip 22 through the FPC 25. The data driver chip 23 and the gate driver chip 22 are disposed on the liquid crystal panel 24 by chip on glass (COG) technology, which are electrically connected with wires (not shown) of the liquid crystal panel 24 through the anisotropic conductive film (ACF), for transmitting image signals to the liquid crystal panel 24.

Referring to FIG. 1, the data driver chip 23 has a multiplexer 31 connecting with the main PCB 21, a first D/A converter 32 and a second D/A converter 33. The multiplexer 31 has a data bus input end 311, a first output end 312 and a second output end 313. The first D/A converter 32 has a first digital input end 321 and a first analog output end 322. The second D/A converter 33 has a second digital input end 331, a second analog input end 332 and a second analog output end 333. The first and the second output ends 312, 313 of the multiplexer 31 respectively connect with the first and the second digital input ends 321, 331 of the first and the second D/A converters 32, 33. The first analog output end 322 of the first D/A converter 32 connects with the second analog input end 332 of the second D/A converter 33. The second analog output end 333 of the second D/A converter 33 electrically connects with the liquid crystal panel 24. The multiplexer 31, the first D/A converter 32 and the second D/A converter 33 are all encapsulated in the data driver chip 23. Only the data bus input end 311 of the multiplexer 31 and the second analog output end 333 of the second D/A converter 33 are formed in the data driver chip 23 through pins, which respectively connect with the main PCB 21 and the liquid crystal panel 24.

Figure 2:
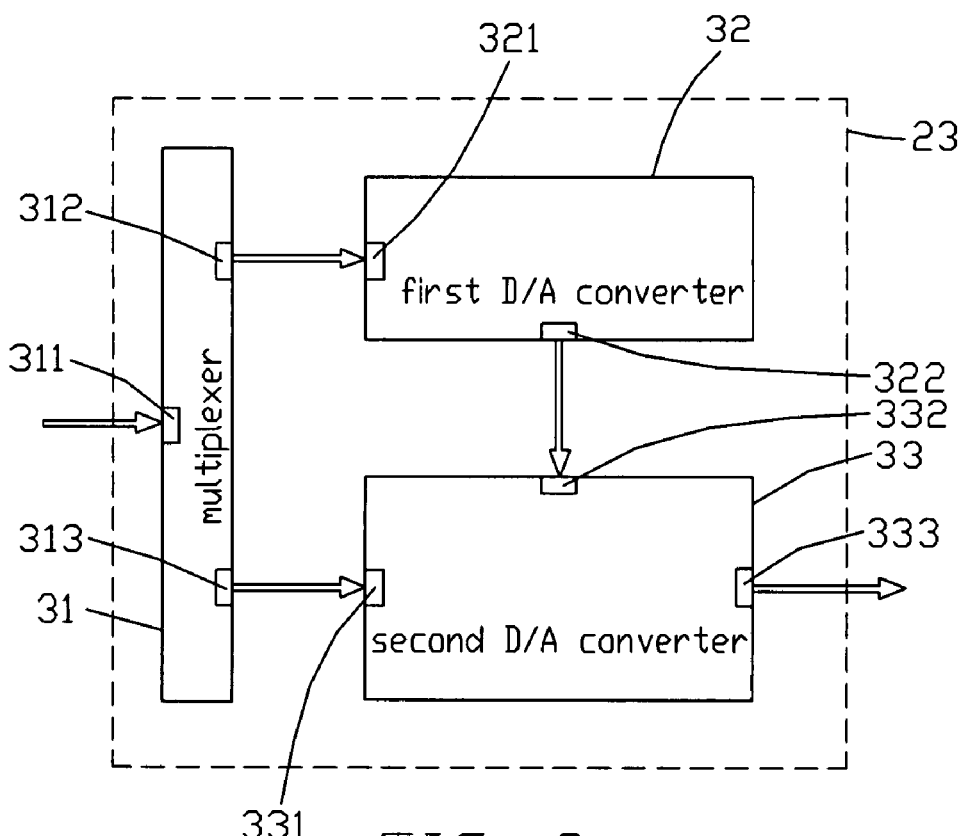
FIG. 2 is a block diagram showing a configuration of the data driver chip showing in the FIG. 1, which has a multiplexer.
Figure 3:
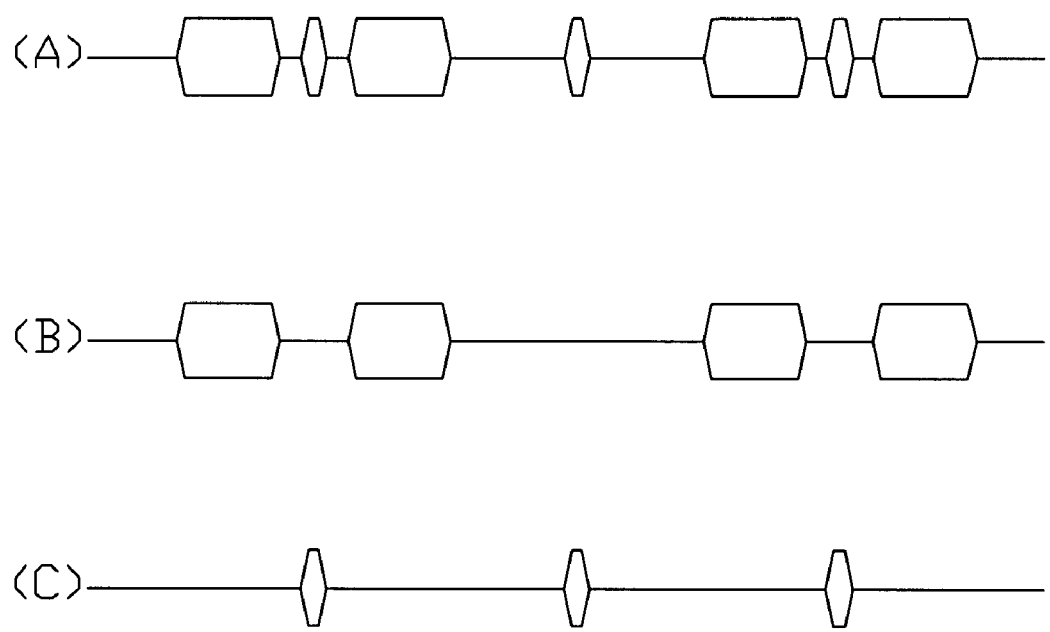
FIG. 3 is a waveform diagram of signals of the multiplexer showing in the FIG. 2.
Figure 4:
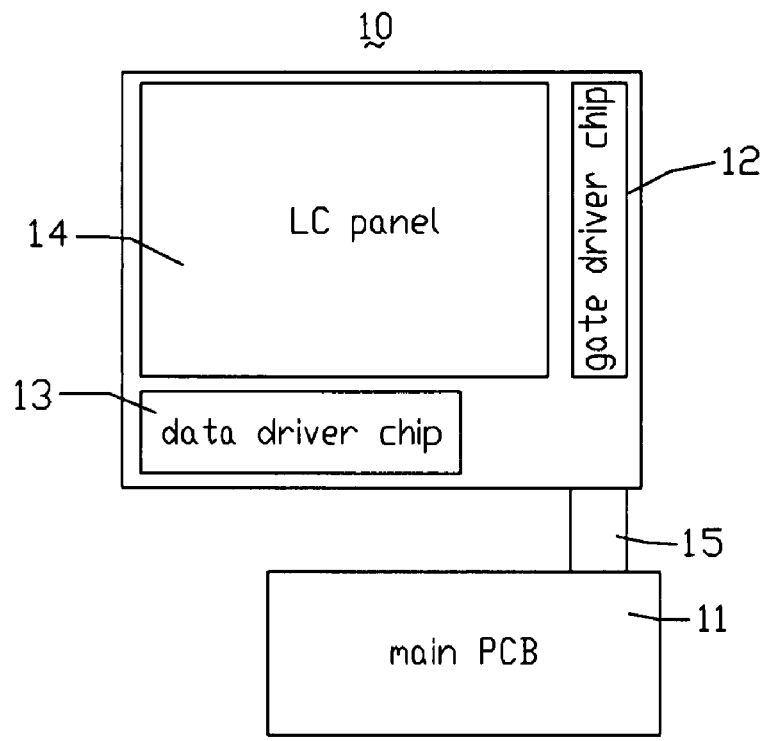
FIG. 4 is a schematic view of a conventional liquid crystal display, which has a data driver chip.
Figure 5:
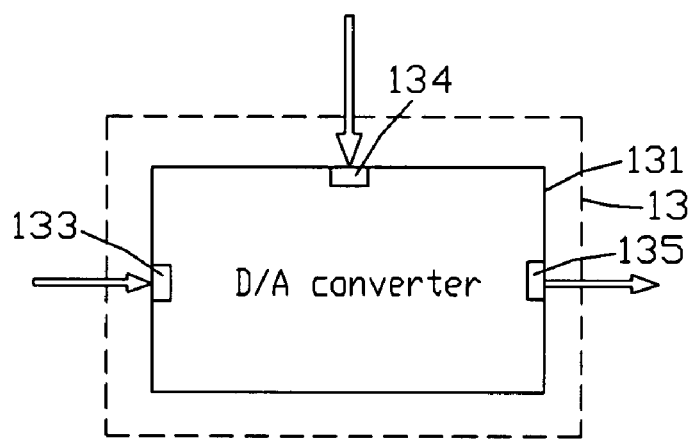
FIG. 5 is a block diagram showing a configuration of the data driver chip showing in the FIG. 4.

FIG. 3 is a waveform diagram of signals of the multiplexer 31 showing in the FIG. 2. FIG. 3(A) is a waveform diagram of signals of the data bus input end 311 of the multiplexer 31; FIG. 3(B) is a waveform diagram of signals of the second output end 313 of the multiplexer 31; FIG. 3(C) is a waveform diagram of signals of the first output end 312 of the multiplexer 31. The data bus input end 311 receives multiplex data stream with the combination of digital video color signals and digital gamma signals, and decomposes the multiplex data stream to digital video color signals (as shown in FIG. 3(B)) and digital gamma signals (as shown in FIG. 3(C)). The digital gamma signals are transmitted to the first D/A converter 32 through the first output end 312 and the first digital input end 321, and are converted to analog gamma signals by the first D/A converter 32. And then the analog gamma signals are sent to the second D/A converter 33 through the first analog output end 322 of the first D/A converter 32 and the second analog input end 332 of the second D/A converter 33. The digital video color signals are directly sent to the second D/A converter 33 through the first output end 312 of the multiplexer 31 and the second digital input end 331 of the second D/A converter 33. The second D/A converter 33 converts the digital video color signals to analog video color signals according to the analog gamma voltage, and sends the analog video color signals to the liquid crystal panel 24 through the second analog output end 333.

Comparing to the typical LCD, the data driver chip 23 further has the multiplexer 31 and the first D/A converter 32, which make the main PCB 21 send the multiplex data stream with the combination of digital video color signals and digital gamma signals through one data bus line. Thus, the data driver chip 23 does not need an analog gamma signal input pin for the second D/A converter 32. Therefore, the data driver chip 23 simplifies the manufacture processes of the liquid crystal display using it.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A data driver chip, comprising:
a multiplexer;
a first digital/analog (D/A) converter; and
a second digital/analog (D/A) converter;
wherein the multiplexer receives a multiplex data stream and decomposes the multiplex data stream to a first signal and a second signal, and respectively sends the first and second signals to the first and the second D/A converters; the first D/A converter converting the first signal to an analog gamma voltage to the second D/A converter, and the second D/A converter converting the second signal to an analog video signal according to the analog gamma voltage.

2. The data driver chip as claimed in claim 1, wherein the multiplexer respectively electrically connects with the first and the second D/A converters, the first D/A converter electrically connecting to the second D/A converter.

3. The data driver chip as claimed in claim 1, wherein the multiplexer has a data bus input end, a first output end and a second output end, the first D/A converter has a first digital input end and a first analog output end, and the second D/A converter has a second digital input end, a second analog input end and a second analog output end, the first and the second output ends of the multiplexer respectively connecting with the first and the second digital input ends of the first and the second D/A converters.

4. The data driver chip as claimed in claim 3, wherein the first analog output end of the first D/A converter connects with the second analog input end of the second D/A converter.

5. The data driver chip as claimed in claim 1, wherein the multiplexer, the first D/A converter and the second D/A converter are all encapsulated in the data driver chip.

6. The data driver chip as claimed in claim 3, wherein the data bus input end of the multiplexer and the second analog output end of the second D/A converter are formed in the data driver chip through pins.

7. A liquid crystal display, comprising:
a liquid crystal panel;
a main print circuit board (PCB);
a gate driver chip electrically connecting the liquid crystal panel and the main PCB; and
a data driver chip;
wherein the data driver chip comprises a multiplexer; a first digital/analog (D/A) converter; and a second digital/analog (D/A) converter electrically connecting with the liquid crystal panel; the multiplexer respectively electrically connecting with the main PCB, the first and the second D/A converters, the first D/A converter electrically connecting to the second D/A converter.

8. The liquid crystal display as claimed in claim 7, wherein the multiplexer receives a multiplex data stream and decomposes the multiplex data stream to a first signal and a second signal, and respectively sends the first and second signals to the first and the second D/A converters; the first D/A converter converting the first signal to an analog gamma voltage to the second D/A converter, and the second D/A converter converting the second signal to analog video signal according to the analog gamma voltage.

9. The liquid crystal display as claimed in claim 7, wherein the multiplexer has a data bus input end, a first output end and a second output end, the first D/A converter has a first digital input end and a first analog output end, and the second D/A converter has a second digital input end, a second analog input end and a second analog output end, the first and the second output ends of the multiplexer respectively connecting with the first and the second digital input ends of the first and the second D/A converters.

10. The liquid crystal display as claimed in claim 9, wherein the first analog output end of the first D/A converter connects with the second analog input end of the second D/A converter.

11. The liquid crystal display as claimed in claim 7, wherein the multiplexer, the first D/A converter and the second D/A converter are all encapsulated in the data driver chip.

12. The liquid crystal display as claimed in claim 9, wherein the data bus input end of the multiplexer and the second analog output end of the second D/A converter are formed in the data driver chip through pins.

13. The liquid crystal display as claimed in claim 9, wherein the data and the gate driver chips are encapsulated on the liquid crystal panel by chip on glass technology.

* * * * *